Nov. 19, 1963 H. RÖHR 3,111,589

ELECTRIC DEVICES FOR PERFORMING LOGIC FUNCTIONS

Filed Sept. 20, 1961 3 Sheets-Sheet 1

Nov. 19, 1963 H. RÖHR 3,111,589

ELECTRIC DEVICES FOR PERFORMING LOGIC FUNCTIONS

Filed Sept. 20, 1961 3 Sheets-Sheet 3

United States Patent Office 3,111,589

Patented Nov. 19, 1963

3,111,589

ELECTRIC DEVICES FOR PERFORMING LOGIC FUNCTIONS

Hans Röhr, Munich, Germany, assignor to Siemens-Schuckertwerke Aktiengesellschaft, Berlin-Siemensstadt, Germany, a corporation of Germany Filed Sept. 20, 1961, Ser. No. 141,562
Claims priority, application Germany Sept. 22, 1960
27 Claims. (Cl. 307—88)

My invention relates to logic circuits for digital data processing and, in one of its more particular aspects, to circuit elements or subassemblies applicable alone or as modular components in digital data systems.

The purpose of such logic function devices is to furnish a definite output signal in dependence upon a predetermined relation between a plurality of input magnitudes. In principle, this can be done by means of electro-mechanical relays. They have the advantage of electrically insulating the controlling input circuits from the circuits being controlled. However, they can operate only at a low switching frequency, and become worn out at the mechanical contacts, thus demanding continual maintenance while offering a rather limited itme of useful life depending upon the number of switching operations performed, aside from the generally very large space requirements of such relays. To avoid these disadvantages, the logic function circuits now preferred operate electronically and, as a rule, are equipped with semiconductor components such as transistors, diodes or the like solid-state devices. Often, however, it is detremental that with such semiconductor devices the input circuits are decoupled neither from each other nor from the output circuit. In highly complex systems, comprising a great number of interwired logic function elements, such a galvanic coupling between circuits tends to cause faulty operations. It has been proposed to design logic function elements on the basis of magnetic switching circuits. However, many of them furnish only fugitive output signals, and all of them share with all other known logic elements of the static type the requirement that each basic function to be performed requires a logic function circuit or element of its own design. Hence a number of different types of logic circuit elements or subassemblies must be produced and kept in readiness. It is therefore desirable to find a way of performing all logic functions with the aid of elements having all the same fundamental design and performance. In principle, this could be done wtih the aid of the so-called "inverted OR-gate." Such devices, however, are uneconomical for many purposes because the realization of relatively simple logical fundamental functions already requires using a plurality of such gate circuits.

It is an object of my invention to devise a circuit element for performing logic functions on magnetic principles with the aid of which the basic functions, as well as a number of complicated combination functions, can be readily performed and which also affords the advantage of a galvanic decoupling between the input-data and output-data circuits.

To this end, and in accordance with a feature of my invention, I provide a logic function element with two magnet cores of material having an essentially rectangular hysteresis loop, and provide the two cores with respective operating windings, each having one end connected with the corresponding end of the other winding and with one terminal point of a voltage-drop resistance member or a corresponding resistive load; and I further provide a direct-current pulse feeder device connected between the other terminal point of the resistance member and the other ends of the two operating windings for separately energizing the two operating windings with direct-voltage pulses of high frequency. The feeder device may consist essentially of an electrically operating switching device, for example, which switches a direct voltage alternately upon two feeder output leads and thus onto the two operating windings of the respective magnetizable cores. For permitting a very rapid switching sequence of the logic element, it is preferable to select a correspondingly high switching frequency of the feeder device. The feeder device then furnishes pulses of the same frequency. The feeder device is preferably so designed that it furnishes an essentially constant pulse-voltage amplitude within the power range required in normal operation.

It is particularly of advantage to provide such a feeder device with transistors or similar controllable semiconductor components operating as choppers. The keying ratio of the pulses, that is the ratio of pulse duration to pulse spacing, is preferably chosen equal to unity so that the two pulse voltages furnished by the feeder device, being equal to each other as regards shape and voltage-time areas (integrals), differ from each other only in that the pulses at the two output leads of the feeder device are time displaced, the pulse at each output lead commencing exactly at the moment when the pulse at the other output lead is terminated.

According to another feature of my invention, the above-mentioned two cores are jointly provided with a number of control circuits of which each is inductively linked in the same magnetizing sense with both cores. Each control circuit preferably comprises a control winding common to both cores. At least one of the control circuits or control windings is connected to a source of constant direct voltage which is preferably adjustable as to magnitude and polarity, for the purpose of biasing both cores by corresponding premagnetization of a polarity and magnitude that determine the type of logical function to be performed. The other control circuit or circuits are provided with controllable signal-voltage supplies respectively so that each magnetizes both cores in the same sense in accordance with a datum or input value represented by the magnitude and polarity of the signal voltage applied. By placing the two cores above one another and winding the input windings and the premagnetizing winding jointly about both cores, a space-saving design, such as a miniaturized (building-block) component is obtained, aside from the fact that no magnetic coupling exists between the operating windings of the respective cores and the control windings common to the two cores.

It has further been found preferable to adapt the magnetic material, winding and control voltages to one another in such a manner that the magnetic field strength produced in the cores is always equal to the product of the saturation field strength of the magnetic material multiplied with an integral positive or negative value between zero and the number of the data-input windings. As mentioned, the logic function to be performed is determined by siutable premagnetization. As will be explained below, the input magnitudes, which appear negated in the logic function to be performed, are supplied to the input windings with the poling required to make the resulting magnetization oppose the magnetization caused by the non-negated magnitudes.

A logic function element possessing the above-described features of the invention requires only one or two input windings for performing the three basic functions: negation, conjunction and disjunction. If the two cores are provided with more than two input windings, the same element can also be used for performing combinations of the basic functions. This permits, in many cases, a reduction in the number of necessary components to an extent not obtainable with any of the logic elements heretofore known, yet the output from an element according to the invention is available, not in the form of fugitive voltage pulses, but as a static direct voltage which persists as long as the relation of the input magnitude necessary for the output data is being maintained.

The foregoing and other objects, advantages and features of my invention will appear from, and will be described and explained in, the following with reference to the drawings in which:

FIG. 1 shows schematically and by way of example an embodiment of a logic function element according to the invention.

FIG. 2 relates to the same embodiment and indicates the winding sense of the control windings on the two magnetizable cores of the element.

Figure 1:
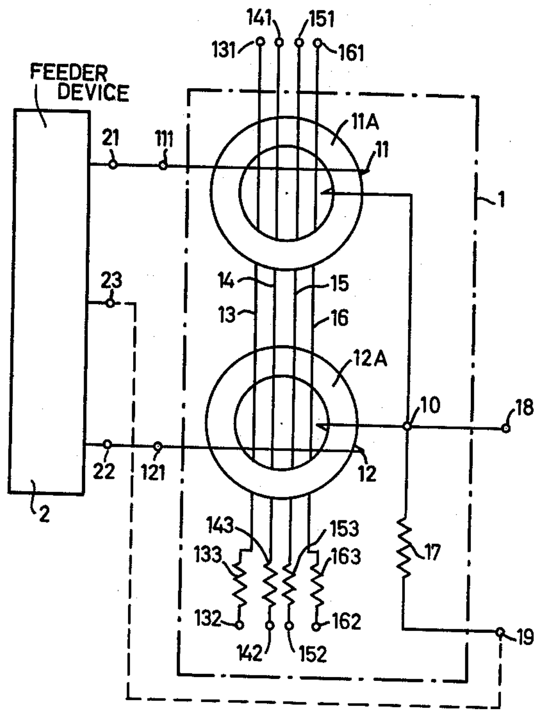
Figure 4:
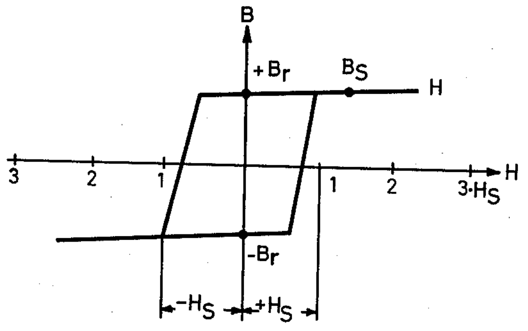
FIG. 4 is a hysteresis characteristic explanatory of the operation of the same logic element.

The logic element denated as a whole by 1 in FIG. 1 comprises two cores 11A, 12A of magnetizable material having preferably a nearly rectangular hysteresis loop as exemplified in FIG. 4, so that the magnitude of the saturation induction ($B_s$) does not appreciably differ from that of the remanence induction ($B_r$). In order to maintain the controlling power low, it is further preferable to select a core material whose hysteresis loop is as narrow as feasible. Each core is provided with an operating winding 11 or 12. Respective ends of the two windings are connected with each other at point 10 and are also connected to an output terminal 18 of the logic element. Point 10 is connected through a resistance member 17 with another output terminal 19. The input terminal 111 of winding 11 is connected to a terminal 21 of a feeder device 2, and the input terminal 121 of winding 12 is connected to another terminal 22 of the feeder device 2. The intermediate or zero-potential terminal 23 of device 2 is connected to the terminal 19 during operation of the logic element.

Figure 3:
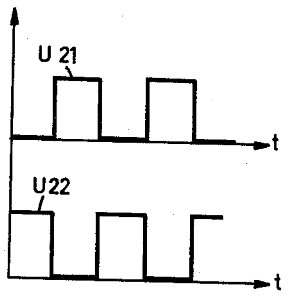
FIG. 3 is an explanatory voltage-time graph.
Figure 2:
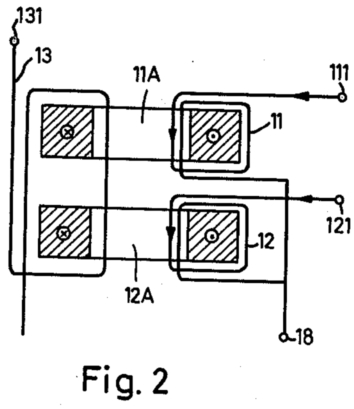

The feeder device 2 may otherwise be identical with one of those described hereinafter with reference to FIGS. 5 and 6. However, for further explaining and understanding the operation of the logic element according to FIGS. 1 and 2, it will suffice to keep in mind that the feeder device 2 furnishes between terminals 21 and 23 a direct pulse voltage U21 according to FIG. 3, and between terminals 22 and 23 a similar pulse voltage U22. Both pulse voltages have the same square wave shape and differ from each other in that each of these voltages is at full value while the other is at zero.

Both magnet cores 11A, 12A have several control circuits 13, 14, 15, 16 in common. The circuit or winding 13 is connected in series with a resistor 133 between terminals 131 and 132. The circuits 14 to 16, also common to both cores, are signal (data) input windings. The circuit or winding 14 is connected in series with a resistor 143 between terminals 141 and 142, the winding 15 is connected in series with a resistor 153 between terminals 151 and 152, and the winding 16 is connected in series with a resistor 163 between terminals 161 and 162.

In the following description of the operation it is assumed that the number of turns of the input windings and premagnetizing windings (13 to 16), the resistances of the series resistors (133, 143, 153, 163) as well as magnitudes of the control voltages (applied to the terminals 131—132, 141—142, 151—152, 161—162) are so chosen relative to one another that the field strength caused by means of these windings in the two cores is equal to the saturation field strength of the cores or is equal to an integral positive or negtive multiple of the saturation field strength. Assume, for example, that both magnet cores 11A, 12A are in condition of positive remanence ($+B_r$ in FIG. 4) and that no current flows through the control circuits (13 to 16). The connection of the feeder device 2 with the operating windings 11 and 12 is such that the direct-voltage feeder pulses magnetize the cores in the same direction, this direction being here assumed to be "positive." Under these conditions, and for a core material having an ideal hysteresis loop and a negligibly small resistance of the operating windings 11 and 12, the full pulse voltage furnished from the feeder device 2 is impressed across the resistance 17. If the pulses are exactly rectangular so that the pulses at one output terminal of the logic element fit accurately into the pulse gap of the voltage at the other output terminal, then the voltage obtaining between the two output terminals 18 and 19 is a coninuous direct voltage whose magnitude is equal to the amplitude of the feeder-pulse voltage. If now, for example, one of the input windings (14, 15, 16) or the premagnetizing winding (13) is traversed by current of such a direction that this winding tends to magnetize the cores in the positive direction, in other words, if this current has a magnetizing effect of the same direction as the feeder pulses, then no change occurs in the output signal between the terminals 18 and 19 of the logic element. However, if one of the control windings of the cores, for example the premagnetizing winding 13, is traversed by current in the reverse sense so that the magnet cores are in the condition of negative saturation, for example at the point $H_s$, then both cores are controlled by each feeder pulse to pass from negative to positive saturation. In this case the operating windings 11, 12 of the respective cores have a high inductive reactance due to the intensive and abrupt change in induction. Consequently, with a suitable dimensioning of the operating windings, nearly the entire voltage-time integral (area) of the feeder pulse is applied to the operating windings. Therefore only the very slight magnetizing current will now pass through the resistance 17. That is, now the output voltage between the output terminals 18 and 19 of the logic element is nearly zero. As long as the cores remain in saturated condition on account of the controlling magnetization, the output signal obtained in this manner is practically an uninterrupted direct voltage, although the operating windings are fed with a pulse voltage of high pulse frequency in which each individual pulse is followed by a pause of the same duration as that of the pulse itself. The two operating windings therefore act like alternating-current energized inductivities if the magnet cores, being subjected to controlling flux at the beginning of a feeder pulse, are not in condition of positive saturation. By combination of the two pulses furnished through the separate operating windings, a static direct-voltage output signal is thus obtained which is adjustable by the change in saturation controlled by the control circuits of the logic function element.

If the magnitude of the output voltage between terminals 18 and 19 is designated by $x$, the above-described performance can be expressed as follows:

(1) $$\text{for } x=0: \sum H \leqq -H_s$$

(2) $$\text{for } x=1: \sum H \geqq 0$$

The value $H_s$ follows from the premagnetization $H_v$ and the control magnetization $H_{st}$, caused by the control windings 13 to 16. The foregoing relations afford determining the conditions for the signs (directions) and magnitudes of the premagnetizing field strength required for performing a given functional combination of input signals.

The foregoing equations further furnish the general rule that negated input signals must always be so applied to the control windings (by corresponding poling of the input voltages) as to produce a negative field strength in the cores, whereas non-negated input signals are to be applied with the polarity required to produce a positive field strength in the cores.

On the basis of these rules, all possible combination functions can readily be performed by employing for each function a properly correlated and poled amount of premagnetizing voltage (to winding 13). The voltage values for the premagnetization are stated in the following table for the various functions that can be performed with a logic element according to the invention, using one, two, three and four input circuits. To identify these performance functions, the expressions usually employed in logical algebra are employed in the table. A letter with a horizontal line above it denotes a negated magnitude.

This manner of expression will be elucidated with reference to two examples. On the first page of the table, in section (*c*), line 3 relates to forming the function $\bar{a}+b+\bar{c}=x$. This means that an output magnitude $x$ is formed if at least the input value $b$ is present or if $a$ or $c$ are not present. The last vertical column of the table indicates that for performing this function a premagnetization of the cores in the amount of $+1(H_s)$ is required.

The last line in section (*c*) of the table relates to the function: $x=abc$. This means that an output magnitude $x$ occurs only when $a$ plus $b$ plus $c$ are present. For performing this logic function the element requires a premagnetization of the cores in the amount of $-3(H_s)$. An example of circuitry for this particular AND-gate function is shown in FIG. 5 and will be described below.

TABLE

*Functions, Directly Performable With One Logic Element, Indicating the Required Premagnetization*

| Function | Premagnetization |
|---|---|
| (*a*) 1 input: $\bar{a}$ (Negation) | 0 |
| (*b*) 2 inputs: $\bar{a}+\bar{b}$ | +1 |
| $\bar{a}+b$ } Implication | 0 |
| $a+\bar{b}$ } Implication | 0 |
| $\bar{a}\bar{b}$ } Implication | 0 |
| $a+b$ Disjunction | −1 |
| $\bar{a}b$ | −1 |
| $a\bar{b}$ | −1 |
| $ab$ Conjunction | −2 |
| (*c*) 3 inputs: $\bar{a}+\bar{b}+\bar{c}$ | +2 |
| $\bar{a}+\bar{b}+c$ | +1 |
| $\bar{a}+b+\bar{c}$ | +1 |
| $a+\bar{b}+\bar{c}$ | +1 |
| $\bar{a}\bar{b}+\bar{a}\bar{c}+\bar{b}\bar{c}$ | +1 |
| $\bar{a}+b+c$ | 0 |
| $a+\bar{b}+c$ | 0 |
| $a+b+\bar{c}$ | 0 |
| $\bar{a}\bar{b}+\bar{a}c+\bar{b}c$ | 0 |
| $\bar{a}b+\bar{a}\bar{c}+b\bar{c}$ | 0 |
| $a\bar{b}+a\bar{c}+\bar{b}\bar{c}$ | 0 |
| $\bar{a}\bar{b}\bar{c}$ | 0 |
| $a+b+c$ | −1 |
| $\bar{a}b+\bar{a}c+bc$ | −1 |

TABLE—Continued

| Function | Premagnetization |
|---|---|
| $a\bar{b}+ac+\bar{b}c$ | −1 |
| $ab+a\bar{c}+b\bar{c}$ | −1 |
| $\bar{a}\bar{b}c$ | −1 |
| $\bar{a}b\bar{c}$ | −1 |
| $a\bar{b}\bar{c}$ | −1 |
| $ab+ac+bc$ | −2 |
| $\bar{a}bc$ | −2 |
| $a\bar{b}c$ | −2 |
| $ab\bar{c}$ | −2 |
| $abc$ | −3 |
| (d) 4 inputs: $\bar{a}+\bar{b}+\bar{c}+\bar{d}$ | +3 |
| $a+\bar{b}+\bar{c}+\bar{d}$ | |
| $\bar{a}+b+\bar{c}+\bar{d}$ | +2 |
| $\bar{a}+\bar{b}+c+\bar{d}$ | +2 |
| $\bar{a}+\bar{b}+\bar{c}+d$ | +2 |
| $\bar{a}\bar{b}+\bar{a}\bar{c}+\bar{a}\bar{d}+\bar{b}\bar{c}+\bar{b}\bar{d}+\bar{c}\bar{d}$ | +2 |
| $\bar{a}+\bar{b}+c+d$ | +1 |
| $\bar{a}+b+\bar{c}+d$ | +1 |
| $\bar{a}+b+c+\bar{d}$ | +1 |
| $a+\bar{b}+\bar{c}+d$ | +1 |
| $a+\bar{b}+c+\bar{d}$ | +1 |
| $a+b+\bar{c}+\bar{d}$ | +1 |
| $a\bar{b}+a\bar{c}+a\bar{d}+\bar{b}\bar{c}+\bar{b}\bar{d}+\bar{c}\bar{d}$ | +1 |
| $\bar{a}b+\bar{a}\bar{c}+\bar{a}\bar{d}+b\bar{c}+b\bar{d}+\bar{c}\bar{d}$ | +1 |
| $\bar{a}\bar{b}+\bar{a}c+\bar{a}\bar{d}+\bar{b}c+\bar{b}\bar{d}+c\bar{d}$ | +1 |
| $\bar{a}\bar{b}+\bar{a}\bar{c}+\bar{a}d+\bar{b}\bar{c}+\bar{b}d+\bar{c}d$ | +1 |
| $\bar{a}\bar{b}\bar{c}+\bar{a}\bar{b}\bar{d}+\bar{b}\bar{c}\bar{d}+\bar{a}\bar{c}\bar{d}$ | +1 |
| $\bar{a}+b+c+d$ | 0 |
| $a+\bar{b}+c+d$ | 0 |
| $a+b+\bar{c}+d$ | 0 |
| $a+b+c+\bar{d}$ | 0 |
| $\bar{a}\bar{b}+\bar{a}c+\bar{a}d+\bar{b}c+bd+cd$ | 0 |
| $\bar{a}b+\bar{a}\bar{c}+\bar{a}d+b\bar{c}+bd+\bar{c}d$ | 0 |
| $\bar{a}b+\bar{a}c+\bar{a}\bar{d}+bc+b\bar{d}+c\bar{d}$ | 0 |
| $a\bar{b}+a\bar{c}+ad+\bar{b}\bar{c}+\bar{b}d+\bar{c}d$ | 0 |
| $a\bar{b}+ac+a\bar{d}+\bar{b}c+\bar{b}\bar{d}+c\bar{d}$ | 0 |
| $ab+a\bar{c}+a\bar{d}+b\bar{c}+b\bar{d}+\bar{c}\bar{d}$ | 0 |
| $a\bar{b}\bar{c}+a\bar{b}\bar{d}+a\bar{c}\bar{d}+\bar{b}\bar{c}\bar{d}$ | 0 |
| $\bar{a}b\bar{c}+\bar{a}b\bar{d}+\bar{a}\bar{c}\bar{d}+b\bar{c}\bar{d}$ | 0 |
| $\bar{a}\bar{b}c+\bar{a}\bar{b}\bar{d}+\bar{a}c\bar{d}+\bar{b}c\bar{d}$ | 0 |
| $\bar{a}\bar{b}\bar{c}+\bar{a}\bar{b}d+\bar{a}\bar{c}d+\bar{b}\bar{c}d$ | 0 |
| $\bar{a}\bar{b}\bar{c}\bar{d}$ | 0 |
| $a+b+c+d$ | −1 |
| $\bar{a}b+\bar{a}c+\bar{a}d+bc+bd+cd$ | −1 |
| $a\bar{b}+ac+ad+\bar{b}c+\bar{b}d+cd$ | −1 |
| $ab+a\bar{c}+ad+b\bar{c}+bd+\bar{c}d$ | −1 |
| $ab+ac+a\bar{d}+bc+b\bar{d}+c\bar{d}$ | −1 |
| $\bar{a}\bar{b}c+\bar{a}\bar{b}d+\bar{a}cd+\bar{b}cd$ | −1 |
| $\bar{a}b\bar{c}+\bar{a}bd+\bar{a}\bar{c}d+b\bar{c}d$ | −1 |
| $\bar{a}bc+\bar{a}b\bar{d}+\bar{a}c\bar{d}+bc\bar{d}$ | −1 |
| $a\bar{b}\bar{c}+a\bar{b}d+a\bar{c}d+\bar{b}\bar{c}d$ | −1 |
| $a\bar{b}c+a\bar{b}\bar{d}+ac\bar{d}+\bar{b}c\bar{d}$ | −1 |
| $ab\bar{c}+ab\bar{d}+a\bar{c}\bar{d}+b\bar{c}\bar{d}$ | −1 |

TABLE—Continued

| Function | Premagnetization |
|---|---|
| $a\bar{b}\bar{c}\bar{d}$ | −1 |
| $\bar{a}b\bar{c}\bar{d}$ | −1 |
| $\bar{a}\bar{b}c\bar{d}$ | −1 |
| $\bar{a}\bar{b}\bar{c}d$ | −1 |
| $ab+ac+ad+bc+bd+cd$ | −2 |
| $\bar{a}bc+\bar{a}bd+\bar{a}cd+bcd$ | −2 |
| $a\bar{b}c+a\bar{b}d+acd+\bar{b}cd$ | −2 |
| $ab\bar{c}+abd+a\bar{c}d+b\bar{c}d$ | −2 |
| $abc+ab\bar{d}+ac\bar{d}+bc\bar{d}$ | −2 |
| $\bar{a}\bar{b}cd$ | −2 |
| $\bar{a}b\bar{c}d$ | −2 |
| $\bar{a}bc\bar{d}$ | −2 |
| $a\bar{b}\bar{c}d$ | −2 |
| $a\bar{b}c\bar{d}$ | −2 |
| $ab\bar{c}\bar{d}$ | −2 |
| $abc+abd+acd+bcd$ | −3 |
| $\bar{a}bcd$ | −3 |
| $a\bar{b}cd$ | −3 |
| $ab\bar{c}d$ | −3 |
| $abc\bar{d}$ | −3 |
| $abcd$ | −4 |

As explained, although the two operating windings on the cores of the logic function element according to the invention receive respective phase-displaced direct-voltage pulses, the output terminals of the element provide zero voltage when the entire voltage-time integral of the feeder pulses is required for saturating the cores, and furnish an approximately continuous direct-voltage signal when the two cores are saturated by the resultant magnetization caused by the totality of control (signal and premagnetizing) windings. The waviness of this output voltage decreases, i.e. the constancy of the output voltage is improved, with an increased accuracy of coincidence between the respective amplitudes, duration and shape of the feeder pulses supplied to the respective windings. It is particularly essential that the pulses follow each other without time gap. It is therefore also an object of my invention to provide a logic function element, embodying the above-mentioned features, with a feeder device of simple design but capable of reliably furnishing feeder pulses of the extreme accuracy just mentioned.

For this purpose, and in accordance with further features of my invention, a direct voltage of constant amplitude is alternately switched upon the two operating windings by means of transistors which are driven in alternating operation by the output voltage of a high-frequency driver stage such as an alternating-voltage generator which comprises a high-frequency oscillator and furnishes an alternating voltage of rectangular wave shape with steepest possible flanks. According to more specific features, this square-wave generator is provided with an output transformer whose secondary winding has a mid-tap, the emitter-collector path of each switching transistor being connected between the mid-tap and one of the respective ends of the secondary winding. It is further preferable to connect a capacitor and a resistor parallel to each other in the base circuit of each transistor of the feeder device, and to dimension this RC member so that it forms a frequency-compensated voltage divider together with the input reactive impedance of the transistor base circuit. In this manner, together with a suitable choice of the core material for the output transformer in the square-wave generator of the driver stage, an extremely great flank steepness can be obtained.

In cases where, for performing a controlling or regulating operation so many logic function elements are required to operate simultaneously that the power output of a single transistor switching stage does not suffice, several such stages can be keyed in parallel connection from a single driver stage such as a square-wave voltage generator as described above.

Figure 5:
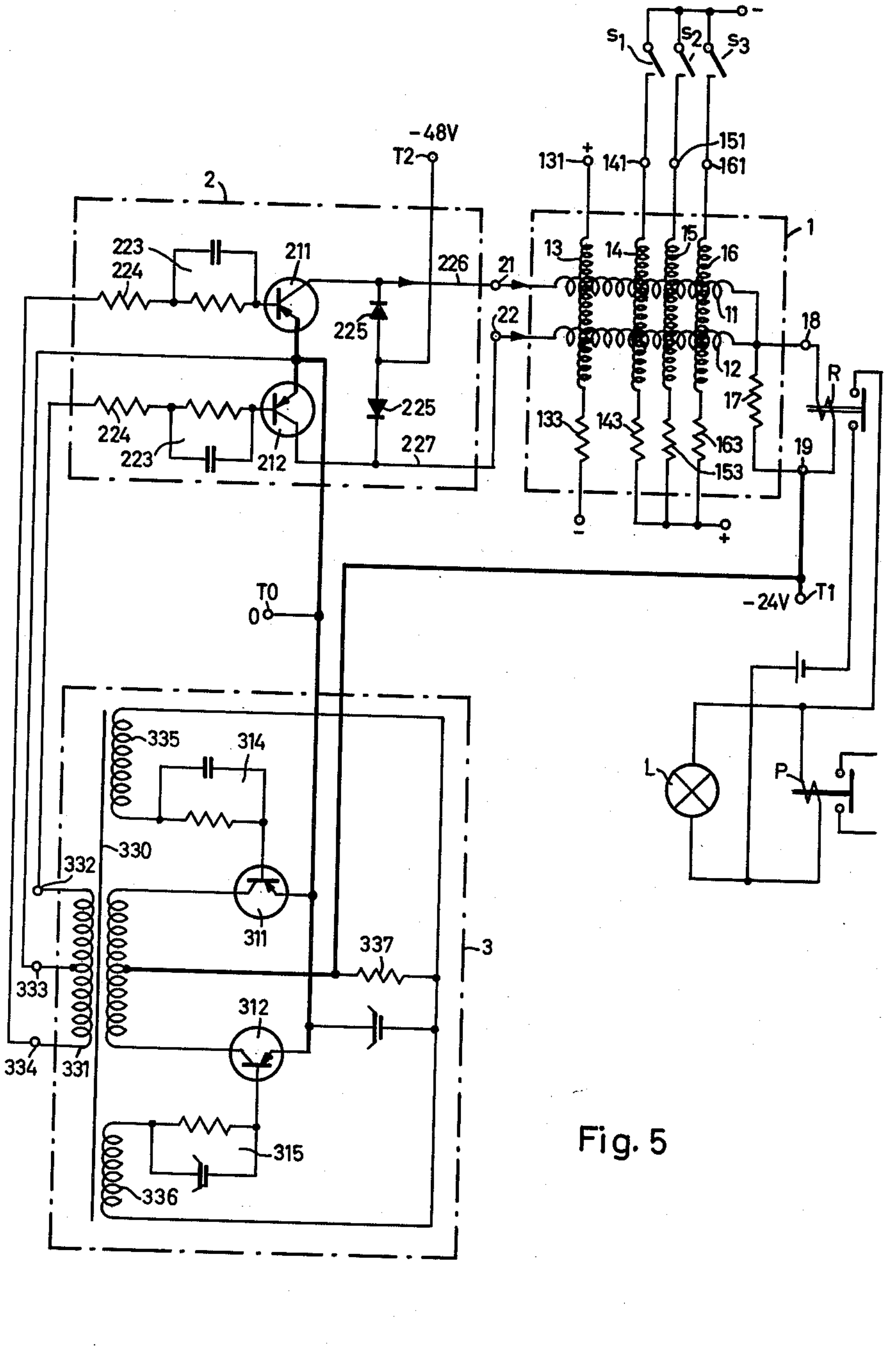
FIG. 5 shows in simplified, symbolic illustration a logic function element corresponding to FIGS. 1 to 4, together with circuit details of the appertaining feeder device, this element being wired for AND-gate function.

The embodiment illustrated in FIG. 5 incorporates the above-mentioned features of a feeder device which supplies square-wave pulses to a logic element, or to a number of such elements, from a transistor switching device under control by a driver stage. The illustrated logic element 1 as such, although shown in a different form of presentation, is identical with the one described above with reference to FIGS. 1 to 4, corresponding components being denoted by the same reference numerals respectievly. The logic element 1 is shown to have its two operating windings 11 and 12 energized at terminals 21 and 22 from a feeder device which comprises a transistor switching stage denoted as a whole by 2, and a driver stage 3 consisting essentially of a square-wave generator. The generator comprises an output transformer 330 whose secondary winding 331 has a mid-tap at 333 between the end terminals 332 and 334. Connected to the likewise mid-tapped primary of transformer 330 are two transistors 311 and 312 whose base circuits comprise respective RC members 314 and 315 and are connected to a feedback winding 335 or 336 of the transformer 330. The other end of each feedback winding is connected through a resistor 337 with the mid-tap of the primary winding and also with a negative power supply terminal T1. The emitters of transistors 311 and 312 are both connected with the positive terminal T0 of the power supply, and the feeder device comprises another negative terminal T2. The terminals T0, T1 and T2 are to be connected to a direct-current source of constant voltage so as to have the respective potentials 0, —24 volts and —48 volts, for example. During operation, the secondary winding 331 furnishes an approximately rectangular voltage whose amplitude and frequency depend upon the dimensioning of the generator components.

The switching stage 2 comprises two transistors 211 and 212. The base of each of these transistors is connected through an RC member 23, consisting of the parallel connection of a resistor and a capacitor, with one of the respective terminals 332, 334 of the secondary winding 331, in series with a resistor 224. The emitter of each transistor 211, 212 is connected with the mid-tap 333 of the secondary winding 331, as well as with the positive power supply terminal T0 of the direct-voltage source.

Connected to the collector of transistor 211 is an output lead to which the terminal 21 of the illustrated logic element, or of a plurality of parallel connected logic elements, as the case may be, is connected. Analogously, the collector of the transistor 212 is connected by an output lead 227 with the terminal 22 of the logic element (or a plurality of parallel-connected elements). The resistance member 17 of the logic element 1 is connected at terminal 19 with the negative terminal T1 (with which also the corresponding resistance member of any parallel connected logic element is to be connected). Since both switching transistors 211, 212 are controlled by the same square-wave voltage, the pulses at the two output terminals of the feeder device can be made to accurately follow each other without gap. The output amplitudes of the pulses are likewise exactly of the same magnitude because they are taken from the same direct-voltage source.

The number of logic elements that can thus be energized from the same electronic switching stage 2 depends upon the power capacity of the latter stage. For example, three logic elements, as shown at 401, 402, 403 in FIG. 9, can readily be energized instead of one element. If more logic elements are needed for performing a complicated function, than can be energized from a single switching stage, the same driver stage 3 can be connected to a corresponding number of parallel operating switching stages 2, each furnishing the operating pulses to a group of logic elements.

For limitation of induction voltages, the switching circuits of stage 2 are preferably provided with two diodes 225, each having its anode connected with the collector of one of the two transistors and its cathode with the terminal T2 of the direct-current source which terminal is more negative than terminal T1. As mentioned, the primary source of direct current in the illustrated embodiment has a voltage of 48 volts. The maximum blocking voltage occurring in the emitter-collector path of the switching transistors 211, 212 is thus limited to a value resulting from the sum of this source voltage and the threshold voltage of the diodes.

At a moment when the voltage of the square-wave generator 3 at the secondary winding 331 of its output transformer is positive at terminal 332 and negative at terminal 334, the switching transistor 211 is turned off and the transistor 212 is simultaneously turned on. Consequently the voltage source now furnishes from its positive pole T0 through the emitter-collector path of switching transistor 212 through lead 227 a constant voltage to the operating winding 12 of the logic element. As soon as the polarity of the generator voltage changes, this taking place at the frequency of the generator 3, the switching transistor 212 is turned off and the transistor 211 is simultaneously turned on. The direct voltage of the source is now connected through the emitter-collector path of transistor 211 and lead 226 to the operating winding 11 of the logic element.

The particular circuit connections shown for the logic function element 1 in FIG. 5 exemplify a function of the AND-gate type. Connected to the output terminals 18 and 19 of the logic element 1 is a relay R which is supplied with pick-up voltage only when all three signal circuits are closed at switches $s_1$, $s_2$ and $s_3$ so that all three control windings 14, 15 and 16 are traversed by current. The switches, here schematically shown as mechanical contacts, may of course consist of electronic or any other type switching devices. In this case, the resistor 133 in series with the premagnetizing winding 13 is to be so dimensioned that the current flowing through winding 13 is three times as large as that flowing through each individual control winding 14, 15, 16; and the polarity of the voltage at terminal 131 is opposed to that at terminals 14, 15 and 16 so that the magnetization caused by the premagnetizing current is opposed to that caused by each control winding. The contact of relay R, when closed, energizes a contactor P and lights an indicator lamp L. The contactor may control a power circuit, for example the control circuit of a machine-tool drive when predetermined conditions, defined by the closing of switches $s_1$, $s_2$ and $s_3$, are met. These switches, for example, are closed only when all protective devices of the machinery are in a prescribed condition.

As described in the foregoing, the switching stage 2 and the keying stage 3 may be designed and installed as separate units. However, they may also be combined to a single electronic unit for feeding one or more logic elements. However, according to another feature of my invention, logic function devices of the type described can be further improved as to versatility of application and interconnection of individual logic elements, by providing each logic element with its own set of switching transistors for chopping the supplied direct current, so that in systems with a multiplicity of logic elements their respective chopper stages can be controlled from a single driver stage.

For good adaptation to the operating or limit frequency of the transistors, it is preferable to choose a very high feeder-pulse frequency for the logic unit, for example, 50,000 c.p.s. Further improvement toward high operating speed is obtainable by designing the iron cores of the logic elements as wound-tape cores for which purpose the material commercially available under the trade name Ultraperm Z has been found well suitable with a tape thickness of 6 microns and 25 turns. Used as a carrier for the wound-tape core is preferably a ring of ceramic material. With a diameter of about 7 mm. or less and an axial height of about 4 mm., a logic element is obtained whose rate of reversal in magnetic polarity satisfactorily corresponds to the operating speed of the other components, thus affording a reliable operation, for example, with a limit frequency of 10,000 c.p.s. for the entire logic function device. It is further preferable to employ operating windings of about 120 turns on the two iron cores. The two cores can be mounted axially above each other, as described above, and can be jointly wound with control and bias windings each having about 25 turns.

As mentioned, it is sufficient for virtually all function performances of interest, to provide the two cores with a total of four control windings of which one is used as premagnetizing or bias winding. Aside from preferably connecting respective small resistors in series with these control windings, the versatility of control can be augmented by providing one or more of the control circuits with an additional tap between the winding and the series-connected resistor.

It is particularly advantageous to mount all components of the logical element on a single carrier so that it forms a single block, particularly a module (or building block) for ready assemblage with other units. Such a block then comprises the two cores with their operating windings, the control windings and series-connected resistors, and the voltage-drop resistance member to which a capacitor, then also part of the block, may be connected in parallel. The block preferably also comprises the above-mentioned switching transistors and the appertaining circuit components of the chopper stage. The block or carrier of the above-mentioned components may be provided with plug pins for attaching and electrically connecting the logic element as a single entity to a respective multiple-socket connector. Such a logic element can further be embedded in an insulating mass, for example in casting resin or epoxy resin, and is preferably given the design of a prismatic body of rectangular cross section having, for example, a size of 3.5 x 2.5 x 2 cm. or less.

The above-mentioned combination of the logic element proper with the appertaining transistor chopper for furnishing the necessary feeder pulses has also the advantage of affording an interconnection of several such elements and controlling them from a common driver unit while avoiding undesired mutual coupling effects between the respective elements. Such logic devices are also particularly favorable with respect to the dimensioning of the switching transistors because these transistors need only provide operating current for the one appertaining logic element and hence can be given small size and accordingly a high limit frequency. The control power required for full control of such transistors is extremely small so that a driver unit capable of simultaneously controlling a relatively large number, for example 40 or more, of such logic elements at the same frequency can be given a very small size.

Figures 6, 7, 8, 9:
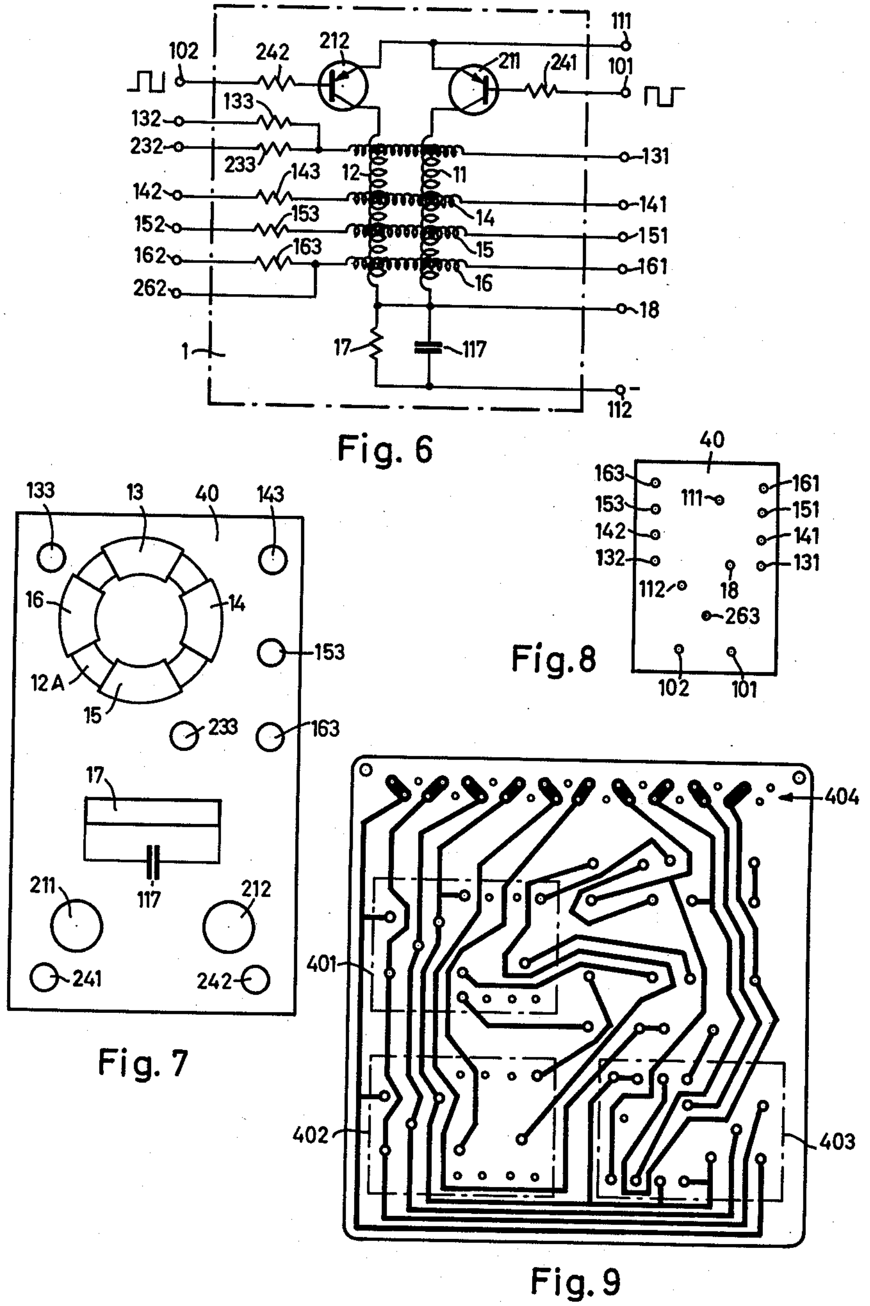
FIG. 6 is the circuit diagram of another logic function element according to the invention which comprises a transistor switching stage for providing the operating windings of the element with square-wave feeder pulses.
FIG. 7 is a front view of an element according to FIG. 6 with its component mounted on a common carrier plate.
FIG. 8 shows the carrier plate from the bottom side for illustration of its plug pins.
FIG. 9 shows an intermediate plate with circuit connections, for three logic function elements according to the invention.

The just-described further features of my invention will be more fully apparent from the embodiment of the logic element shown in FIGS. 6 to 8. This element comprises the same components as those according to FIG. 1 or FIG. 5, corresponding components being denoted in FIG. 6 by the same respective reference numerals as in FIGS. 1, 2 and 5. However, the element 1 of FIG. 6 also incorporates as part of the same unit the two transistors 211 and 212 of the switching stage that serves to alternately supply the respective operating windings 11 and 12 of the two magnet cores with direct-current square-wave pulses. The two operating windings 11, 12 are jointly connected to a resistance member 17 to which a smoothing capacitor 117 is connected in parallel. The capacitor 117 may have a capacitance of 1 mf. and may consist of a tantalum capacitor, for example. The terminals 111 and 112 of the logic element are to be connected to a source of constant direct voltage between 2 and 24 volts, preferably about 6 volts. The terminal 111 is connected with the emitters of the two transistors. The collector of transistor 211 is connected to the operating winding 11. The collector of transistor 212 is connected to the operating winding 12. The resistance member 17 is connected between terminal 112 and the two other ends of the two operating windings.

The base of transistor 211 is connected through a resistor 241 with a terminal 101, and the base of transistor 212 is connected through a resistor 242 with a terminal 102. Junction transistors of the p-n-p type for 50 milliwatt (for example of the commercially available type TF 66) have been found well suitable. The resistors 241 and 242 can be given a rating of 100 ohms and 150 mw.

The control (bias) winding 13 is connected at one end with a terminal 131 and at the other end through a resistor 133 with terminal 132 and through a resistor 233 with another terminal 232. The winding 13 generally serves for premagnetizing the two cores. The resistance values of the two resistors 133 and 233 are preferably in the ratio of 1:2 (for example 280 and 560 ohms respectively). The premagnetizing voltage can be connected between the terminals 131 and 232, or it may be connected jointly to the terminals 132 and 232. In this manner three graduated values are available for premagnetization of the cores, including a ratio of 1:2. As a result, different magnitudes can be imparted to the magnetization required for returning the cores into the saturation range, this being necessary for using the same logic element for respectively different function performances, as apparent from the table.

Another control (signal) winding 14 is connected between terminals 141 and 142 in series with a resistor 143. A control (signal) winding 15 is connected between terminals 151 and 152 in series with resistor 153, and a further control (signal) winding 16 is connected between terminals 161 and 162 through resistor 163 and is also in direct connection with another terminal 263. The resistors 143, 153 and 163 may be given a rating of 470 ohms, 150 mw., for example. The resistance member 17 may be rated for 100 ohms, 1.5 w. The capacitor 117, for example of 1 mf., may be of the electrolytic type.

Each operating winding 11, 12 may be given 120 turns and may be mounted on an annular tape-wound core of approximately 6.6 mm. outer diameter and 4 mm. axial height. Each core may be supported by a ceramic carrier body and may consist, for example, of 25 turns of magnetizable tape having 6 microns thickness. Suitable for the cores is the tape material commercially available under the trade name Ultraperm Z. As explained above, the windings 13 to 16 are each wound about both cores. Each of them may have 25 turns.

With the above-exemplified core and winding dimensions, all components of the logic element can be accommodated on a carrier plate 40 (FIGS. 7, 8) with a printed circuit and of approximately 35 x 25 mm. size. Suitable bores in the plate are provided with respective plug pins (FIG. 8) soldered together with the printed circuit. This can be done, for example, by simultaneously soldering all pins by immersion soldering. In this manner the logic element forms a single building block or module and can thereafter be encased by embedding it in casting resin such as available under the trade name Araldit.

The size of the carrier plate 40 is essentially determined by the mutual spacing between the conductors required in the printed circuit. This size, however, can be further reduced if this is desired, for example, in view of the space requirements in large systems comprising many logic elements or for increasing the limit frequency; and such further reduction then permits a corresponding reduction in the size of the other components in the logic unit up to the limits determined by the windings on the cores, the attainable minimum dimensions of the transistors, resistors and capacitors, as well as by the manufacturing cost involved in further miniaturization.

According to FIG. 7, the two cores 11A, 12A are mounted, one above the other, on the carrier plate 40, only the core 12A being visible in this illustration. The two cores jointly carry the control windings 13, 14, 15, 16. Mounted beneath the cores on plate 40 are the resistor 17, the parallel connected electrolyte capacitor 117, and the two transistors 211 and 212. The resistors 241 and 242 of the transistor circuits are attached at the left and right of the cores. The series resistors 143, 153 and 163 in the circuits of control windings 14, 15, 16 are located at the right of the cores. Also mounted beside the cores are the two resistors 133 and 233 connected in the premagnetizing circuit of winding 13. All resistors are small upright tubular units which, seen from above, appear as circles in FIG. 7.

FIG. 8 shows the rear side of the plate 40 on smaller scale which more closely corresponds to the actual size of the particular embodiment described. This illustration shows the individual plug pins by means of which the entire logic element can be electrically attached and connected with corresponding sockets. The plug pins in FIG. 8 are designated by the same respective numerals as are assigned to the terminals in FIG. 6. Thus, the plug pins 141 and 142 correspond to the terminals of the control winding 14, the plug pins 151 and 152 to those of the control winding 15, the plug pins 161 and 162 to the control winding 16, and the pins 131 and 132 to the premagnetizing winding 13. According to FIG. 8, the winding 13 is provided with only one series resistor and hence with only two terminals and plug pins (131, 132) instead of the three terminals (131, 132, 232) shown in FIG. 6.

A modular design as exemplified by FIGS. 6, 7 and 8 affords the possibility of simply plugging any necessary number of logic elements into different connecting or intermediate plates which carry the necessary electric interconnections or networks required for a variety of logic combination functions to be performed.

Such a connecting plate, comprising a printed circuit, is shown at 400 in FIG. 9. This plate is designed for subtraction corresponding to the equation $$x=u(\bar{a}b+a\bar{b})+\bar{u}(ab+\overline{ab})$$

In this equation, the value $u$ denotes each time the carry-forward amount for the next position. For performing a function of this type, the connecting plate 400 carries three plugged-in logic elements 401, 402, 403 of the same design and construction, as well as two rectifier bridge circuits with four diodes, for example germanium diodes.

If more binary positions are to be subtracted, then such a plate, equipped with three logic elements and two diodes, is provided for each position. Applicable is then the equation $$u_2=u_1\bar{b}_1+a_1\bar{b}_1+a_1u_1$$

wherein $u_2$ denotes the carry-over for the next position and $u_1$ the carry-over from each preceding position.

It is also apparent from FIG. 9 that the connecting plate 400 can be provided with uniform connecting terminals. At the conductor ends in the uppermost horizontal row (at 404) a uniform eleven-pin plug may be connected. Since the entire circuitry is contained in the connecting plate 400, only a minimum of plug connection is needed. For example, when using three logic elements, each having 14 plug connections as shown in FIG. 9, and two rectifier bridge networks each having 4 plug connections, a total of only 10 plug pins are required or utilized on the above-mentioned eleven-pin plug which carries the plate 400.

In a similar manner, a logic element according to the invention can also be designed as a data storage element, it being only necessary to connect the output with the input in the sense of a feedback coupling. This can also be done by inserting a single logic element into a correspondingly wired or printed intermediate plate.

It will be recognized that the invention affords producing all functions virtually required in logic apparatus such as computers, with the aid of uniformly designed, modular logic elements, and providing for the necessary interconnection between two or more of such logic elements by means of intermediate components, such as the above-described interconnecting plates which carry the particular circuitry required for joining the logic elements in accordance with the combination function to be performed thereby.

In many cases, the logic elements, once assembled with each other or with an interconnecting member such as the above-described connecting plate, need not be subsequently taken apart. The plugs of the logic elements can then be soldered together with the respective sockets or eyes of the connecting plate.

The above-described subdivision of the pulse feeder means into a driver unit on the one hand and a chopper with switching transistors in each logical element on the other hand is particularly significant with respect to the attainable frequency limit. This is because the power capacity of the switching transistors is determined by the number of logic elements connected thereto. It may appear desirable to feed a largest possible number of logic units from one and the same chopper device. However, a power transistor that can furnish a sufficiently large current also has a relatively large storage capacity and, therefore, a low frequency limit. As a result, the pulse waves produced by the switching operation assume correspondingly slanting flanks. When such current pulses pass through the operating winding of each saturated core and through the load resistance of member 17, the resulting voltage drop also has a slanting curve shape because this shape is dependent upon the steepness of the pulse flanks. Smaller transistors, namely transistors rated for lower currents, have a correspondingly smaller storage capacity and thus afford producing pulse flanks of considerably greater steepness. Hence, if each transistor set is called upon to provide only the current for its own small logic element, and is given correspondingly small size, the intermittent direct current produced by the chopping action of the transistors has a particularly good rectangular pulse characteristic so that the output voltage of the logic element under load can satisfactorily approach a substantially smooth constant value.

Another advantage is the fact that in this manner a very effective decoupling of a plurality of cooperating logic elements is available. In principle, diodes could be used for decoupling of parallel connected operating windings of respectively different logic elements. However, it is difficult to obtain a full decoupling effect in this manner, and the working point of the individual logic elements may become displaced thus considerably reducing the utilizable limit frequency. The separation and isolation effected by providing each logic element with its own chopper virtually avoids such intercoupling effects and thus also obviates any additional expenditure for decoupling diodes.

While in the foregoing my invention is described with reference to preferred embodiments of logic function elements having only two magnetic cores with respective operating windings and common control circuits per element, it will be understood that the invention is analogously applicable by providing three or more cores per element, each core having its own operating winding and all cores having a number of control circuits in common, the control windings acting jointly upon a single voltage-drop resistance member and being energized by respective square-wave direct pulses of substantially the same amplitude and duration in a cyclical and substantially uninterrupted sequence.

Upon study of this disclosure, it will also be obvious to those skilled in the art that may invention permits of a variety of modifications with respect to components, circuitry and application, and hence may be given embodiments other than particularly illustrated and described herein, without departing from the essential features of my invention and within the scope of the claims annexed hereto.

I claim:

1. An electric device for performing logic functions, comprising a plurality of magnetizable cores of substantially rectangular hysteresis characteristic, said cores having respective separate operating windings, a number of control circuits of which each is inductively linked with all of said cores for providing said cores with bias and signal magnetization, a resistance member, said operating windings having one of their respective ends connected with each other and with said resistance member, direct-current pulse feeder means having an output terminal of one polarity connected through said resistance member with said interconnected winding ends and having a group of output terminals of the other polarity separately connected to the other ends of said respective windings for feeding sequential pulses thereto, said pulse feeder means having at each of said output terminals of the other polarity a square-wave voltage of substantially the same amplitude and of a pulse duration substantially equal to 360° divided by the number of said cores but phase displaced in cyclical relation to the other pulse voltages, whereby the voltage across said resistance member is a susbtantially continuous direct voltage indicative of a logic function determined by excitation of said control circuits.

2. An electric device for performing logic functions, comprising two magnetizable cores of substantially rectangular hysteresis charcteristic, two operating windings of which each is inductively linked with one of said respective cores separate from the other operating winding, a plurality of control circuits inductively linked with both said cores for providing them with bias and signal magnetization, said two operating windings having an output terminal point in common, and square-wave pulse voltage supply means connected to the other terminal points of said respective operating windings for alternately applying respective pulses thereto, whereby the potential of said output point is indicative of a logic function determined by said control circuits.

3. An electric device for performing logic functions, compirsing two magnetizable cores of substantially rectangular hystersis characteristic having separate operating windings respectively and having both in common a number of control windings for providing said cores with bias and signal magnetization, a resistance member, said operating windings being connected at one winding end with each other and with one terminal point of said resistance member, and direct-current pulse supply means connected between the other terminal point of said resistance member and the other ends of said two operating windings and having an uninterrupted sequence of alternate square-wave pulse voltages at said respective other ends, whereby the voltage of said resistance member is indicative of a logic function determined by excitation of said control windings.

4. A logic function device according to claim 3, comprising a capacitor connected in parallel to said resistance member.

5. In a logic function device according to claim 3, each of said control windings having two terminals for connection to direct-current supply means, and respective ohmic resistors of which each is connected in series between one of said respective control windings and its two terminals.

6. In a logic function device according to claim 3, said pulse supply means comprising positive and negative direct-voltage supply leads of which one is connected to said other terminal point, and two alternately operative switching members connected between said other of said supply leads and said respective other ends of said operating windings.

7. A logic function device comprising two magnetizable cores of substantially rectangular hysteresis characteristic having separate windings respectively and having a number of control circuits inductively linked with both cores for providing them with bias and signal magnetization, direct-current pulse feeder means having a terminal of one polarity and two terminals of the other polarity and having at said two terminals of the other polarity respective square-wave pulse voltages of the same frequency, amplitude and duration of which each commences when the other terminates, a resistance member having one end connected to said terminal of said one polarity and having the other end connected through said respective windings with said two other terminals, said windings being poled as required for said respective pulses to magnetize said two cores in the same sense relative to said control circuits, whereby the voltage of said resistance member is indicative of a logic function determined by excitation of said control circuits.

8. A logic function device comprising two magnetizable cores of substantially rectangular hysteresis characteristic having separate operating windings respectively and having a number of control circuits inductively linked with both cores for providing them with bias and signal magnetization, direct-current pulse feeder means having a terminal of one polarity and two other terminals of the other polarity and having at said two other terminals respective square-wave pulse voltages of the same frequency, amplitude and duration of which each commences when the other terminates, and a resistance member serially connected between said terminal of said one polarity and through said two other terminals with said respective operating windings serially interposed between said resistance member and said respective two other terminals, one of said control circuits having direct-current supply means of constant voltage adjustable in accordance with a selected bias magnetization of said cores required for performing a given logic function, at least one of said other control circuits having direct-current supply means and switch means for controlling the signal current flowing in said other control circuit, whereby the voltage drop of said resistance member is indicative of the logic function to be performed.

9. In a logic function device according to claim 8, said control circuits having respective control windings common to both said cores, said cores having a given saturation field strength, and said control windings having a number of turns which in relation to the voltages of said control circuits corresponds to a resultant induced field strength in said cores equal to the product of said saturation field strength times an integral positive or negative number between zero and said number of turns.

10. A logic function device comprising two magnetizable cores of substantially rectangular hysteresis characteristic having separate windings respectively and having a number of control circuits inductively linked with both cores for providing them with bias and signal magnetization, direct-current pulse feeder means having a terminal of one polarity and two other terminals of the other polarity and having at said two other terminals respective square-wave pulse voltages of the same frequency, amplitude and duration of which each commences when the other terminates, and a resistance member serially connected between said terminal of said one polarity and said two other terminals with said windings serially interposed between said resistance member and said respective two other terminals, one of said control circuits having means for supplying constant direct voltage to apply a premagnetizing bias to said two cores for thereby selecting the logic function to be performed, means for supplying respective direct voltages of selected respective polarities to said other control circuits for providing respective input data for said logic function, said polarities of said means being such that input data that occur negated in the function are applied in magnetic opposition to nonnegated input data.

11. A logic function device comprising two magnetizable cores of substantially rectangular hysteresis characteristic having separate windings respectively and having a number of control circuits inductively linked with both cores for providing them with bias and signal magnetization, positive and negative direct-voltage leads, a resistance member, said two windings being connected parallel to each other and in series with said resistance member between said direct-voltage leads, two electronic switches having respective main paths serially interposed between said respective windings and one of said leads and having respective switch control circuits, and oscillatory driver means connected to said switch control circuits for alternately controlling said switches to pass a gapless sequence of square-wave direct pulses alternately through said windings.

12. A logic function device comprising two magnetizable cores of substantially rectangular hysteresis characteristic having separate windings respectively and having a number of control circuits inductively linked with both cores for providing them with bias and signal magnetization, positive and negative direct-voltage leads, a resistance member, said separate windings being connected parallel to each other and in series with said resistance member between said direct-voltage leads, two switching transistors having respective emitter-collector paths serially interposed between said respective windings and one of said leads and having respective base circuits, and a driver stage having an alternating-current generator of approximately rectangular wave shape to which said two base circuits are connected in phase-opposed relation to each other for alternately switching said transistors to pass a substantially gapless sequence of rectangular-wave direct-current pulses alternately through said windings.

13. In a logic device according to claim 12, said driver stage having direct-current supply means, and said alternating-current generator comprising an inverter circuit of transistors and an output transformer connected with each other, said transistors having oscillatory base circuits feedback-coupled with said transformer, and said transformer having a secondary winding with a mid-tap connected to said one lead and two terminal points connected to said respective base circuits of said two switching transistors.

14. In a logic device according to claim 13, said two switching transistors having their respective collectors connected with said respective windings, said positive direct-voltage lead being connected with the emitters of said two switching transistors and with said mid-tap of said transformer, and said negative direct-voltage lead being connected to said resistance member.

15. A logic device according to claim 14 comprising two diodes having respective anodes connected with the respective collectors of said two switching transistors and having respective cathodes connected with each other, and a source of negative bias voltage connected to said two cathodes.

16. A logic device according to claim 12, comprising a resistor and a capacitor connected parallel to each other in each base circuit of said switching transistors.

17. In a logic function device according to claim 12, said driver stage forming a mounting unit separate from said switching transistors and being rated for driving a plurality of pairs of switching transistors to operate a corresponding plurality of pairs of logic function units.

18. In a logic function device according to claim 12, said driver stage having a frequency of at least 20,000 c.p.s.

19. A logic function device comprising two magnetizable cores of substantially rectangular hysteresis characteristic having separate windings respectively and having a number of control circuits inductively linked with both cores for providing them with bias and signal magnetization, positive and negative direct-voltage leads, a resistance member, said two windings being connected parallel to each other and in series with said resistance member between said direct-voltage leads, two switching transistors having respective emitter-collector paths serially interposed between said respective windings and one of said leads and having respective base circuits, said two cores, resistance member and switching transistors having a mounting structure in common and forming jointly a single logic function element.

20. In a logic function device according to claim 19, said mounting structure of said element comprising a group of plug pins for attachment of the element to associated circuits.

21. In a logic function device according to claim 20, said element comprising resistors series connected in said respective control circuits and in said respective base circuits.

22. In a logic function device according to claim 19, said mounting structure of said element comprising a group of plug pins for attachment of the element to associated circuits, and said element comprising a solid mass of insulating material in which said cores, windings, transistors and resistance member are embedded.

23. In a logic function device according to claim 20, said element comprising additional resistors on said mounting structure, said additional resistors each having one end connected to one of said control circuits and the other end to respective plug pins in parallel relation to each other.

24. A logic function device comprising two tape-wound ring cores of high-permeability material having a substantially rectangular hysteresis characteristic and having separate respective operating windings, and a number of control windings of which each is common to both ring cores, direct-current supply means of adjustable constant voltage connected with one of said control windings for providing selected constant premagnetization of said two cores, direct-current signal means connected to said other control windings to provide said cores with input-data magnetization, direct-current pulse feeder means having a terminal of one polarity and two terminals of the other polarity and having at said two terminals respective square-wave pulse voltages of the same frequency, amplitude and duration of which each commences when the other terminates, and a resistance member serially connected between the terminal of said one polarity and through both said operating windings separately with said two other terminals, whereby the voltage drop of said resistance member is indicative of a logic function depending upon said premagnetization and determined by said input-data magnetization.

25. In a logic function device according to claim 24, each of said ring cores having about 25 turns of about 6 micron tape thickness, each of said operating windings having about 120 turns, and each of said control windings having about 25 turns.

26. An electric device for performing logic function comprising a plurality of modular logic function elements each having two magnetizable cores of substantially rectangular hysteresis characteristic and two windings on said respective cores and having a number of control circuits inductively linked with both cores for providing them with bias and signal magnetization, each logic function element having a resistance member, a direct-current pulse feeder means having a lead of one polarity and two leads of the other polarity of which the latter are connected separately to said two windings, said resistance member being connected between said one lead and both of said windings, and each of said elements having a carrier structure and having a group of plug pins mounted on said structure and electrically connected with said leads and with said control circuits and resistance member; and an interconnecting plate having connecting circuitry secured thereto and corresponding to a given logic function to be jointly performed by said plurality of logic function elements, said plate having respective groups of contact sockets electrically connected with said circuitry and engaged by said groups of plug pins of said respective elements.

27. In a logic function device according to claim 26, said interconnecting plate having further sockets connected with said circuitry for engagement by accessory circuit components.

No references cited.